United States Patent
Rajavi et al.

(10) Patent No.: US 9,300,249 B2
(45) Date of Patent: Mar. 29, 2016

(54) DIFFERENTIAL CRYSTAL OSCILLATOR CIRCUIT

(71) Applicant: QUALCOMM Incorporated, San Diego, CA (US)

(72) Inventors: Yashar Rajavi, Mountain View, CA (US); Amirpouya Kavousian, San Jose, CA (US); Alireza Khalili, Sunnyvale, CA (US); Mohammad Bagher Vahid Far, San Jose, CA (US); Abbas Komijani, Mountain View, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/338,241

(22) Filed: Jul. 22, 2014

(65) Prior Publication Data

US 2016/0028349 A1    Jan. 28, 2016

(51) Int. Cl.
 *H03B 5/32* (2006.01)
 *H03B 5/36* (2006.01)
(52) U.S. Cl.
 CPC . *H03B 5/364* (2013.01); *H03B 5/36* (2013.01)
(58) Field of Classification Search
 CPC .................................. H03B 5/36; H03B 5/364
 USPC .................... 331/158, 116 R, 116 FE
 See application file for complete search history.

(56) References Cited

U.S. PATENT DOCUMENTS

| 6,542,042 | B1 | 4/2003 | Atkinson |
| 6,696,898 | B1 * | 2/2004 | Ward et al. ............. 331/116 FE |
| 6,798,304 | B2 | 9/2004 | Gomez |
| 7,391,278 | B2 | 6/2008 | Berens |
| 7,768,359 | B2 | 8/2010 | Chang et al. |
| 2007/0262825 | A1 | 11/2007 | Kitamura et al. |
| 2008/0238561 | A1 | 10/2008 | Otsuka et al. |

(Continued)

FOREIGN PATENT DOCUMENTS

EP       1265352 A1    12/2002

OTHER PUBLICATIONS

Ruffieux D., "A High-Stability, Ultra-Low-Power Differential Oscillator Circuit for Demanding Radio Applications," Proceedings of the 28th European Solid-State Circuits Conference, 2002, pp. 85-88.

(Continued)

*Primary Examiner* — Arnold Kinkead

(74) *Attorney, Agent, or Firm* — Procopio, Cory, Hargreaves & Savitch, LLP

(57) ABSTRACT

A differential crystal oscillator circuit, including: first and second output terminals; a cross-coupled oscillation unit including first and second transistors cross-coupled to the first and second output terminals; first and second metal-oxide semiconductor field-effect transistor (MOSFET) diodes, each MOSFET diode including a resistor connected between gate and drain terminals, wherein the first MOSFET diode couples to the first transistor to provide low-impedance load at low frequencies and high-impedance load at higher frequencies to the first transistor, wherein the second MOSFET diode couples to the second transistor to provide low-impedance load at low frequencies and high-impedance load at higher frequencies to the second transistor; and a reference resonator coupled between the first and second output terminals to establish an oscillation frequency.

16 Claims, 6 Drawing Sheets

(56) References Cited

U.S. PATENT DOCUMENTS

2011/0074513 A1 3/2011 Bao
2014/0043106 A1 2/2014 Samala

OTHER PUBLICATIONS

International Search Report and Written Opinion—PCT/US2015/036055 ISA/EPO—Aug. 20, 2015.

* cited by examiner

DIFFERENTIAL CRYSTAL OSCILLATOR CIRCUIT

BACKGROUND

1. Field

This invention relates to crystal oscillator circuits, and more specifically, to differential crystal oscillators.

2. Background

A crystal oscillator (XO) circuit is a critical component of an RF system and is used for reference frequency generation in transceivers. For these transceivers, responses to a frequency different from that to which the transceivers are tuned (spurious responses) are one of the challenging issues. The XO harmonics can easily couple to other RF circuits through multiple paths and appear at receiver and transmitter outputs. Compared to a single-ended structure, a differential XO circuit is desirable due to better immunities to interference and spurious responses. However, the lack of a low-impedance DC path in the XO circuit causes the circuit to latch up rather than oscillate. Conventional differential XO circuit designs have used a negative conductance (−gm) of a modified cross-coupled pair of transistors as an active device and have added high-pass filtering to avoid latching at low frequencies.

SUMMARY

The present invention provides for generating an oscillation frequency at output terminals of a differential oscillator circuit.

In one embodiment, a differential crystal oscillator circuit is disclosed. The circuit includes: first and second output terminals; a cross-coupled oscillation unit including first and second transistors cross-coupled to the first and second output terminals; first and second metal-oxide semiconductor field-effect transistor (MOSFET) diodes, each MOSFET diode including a resistor connected between gate and drain terminals, wherein the first MOSFET diode couples to the first transistor to provide low-impedance load at low frequencies and high-impedance load at higher frequencies to the first transistor, wherein the second MOSFET diode couples to the second transistor to provide low-impedance load at low frequencies and high-impedance load at higher frequencies to the second transistor; and a reference resonator coupled between the first and second output terminals to establish an oscillation frequency.

In another embodiment, a method for generating an oscillation frequency at output terminals of a differential oscillator circuit is disclosed. The method includes: generating the oscillation frequency using a cross-coupled pair of transistors and a reference resonator coupled between the output terminals; and producing low-impedance load at low frequencies and high-impedance load at higher frequencies using MOSFET diodes coupled to the cross-coupled pair of transistors, wherein each of the MOSFET diodes includes a resistor connected between gate and drain terminals.

In yet another embodiment, an apparatus for generating an oscillation frequency at output terminals of a differential oscillator circuit is disclosed. The apparatus includes: means for generating the oscillation frequency by driving a reference resonator coupled between the output terminals; and means for producing low-impedance load at low frequencies and high-impedance load at higher frequencies, wherein the means for producing is coupled to the means for generating Other features and advantages of the present invention should be apparent from the present description which illustrates, by way of example, aspects of the invention.

BRIEF DESCRIPTION OF THE DRAWINGS

The details of the present invention, both as to its structure and operation, may be gleaned in part by study of the appended further drawings, in which like reference numerals refer to like parts, and in which.

DETAILED DESCRIPTION

Figure 1:
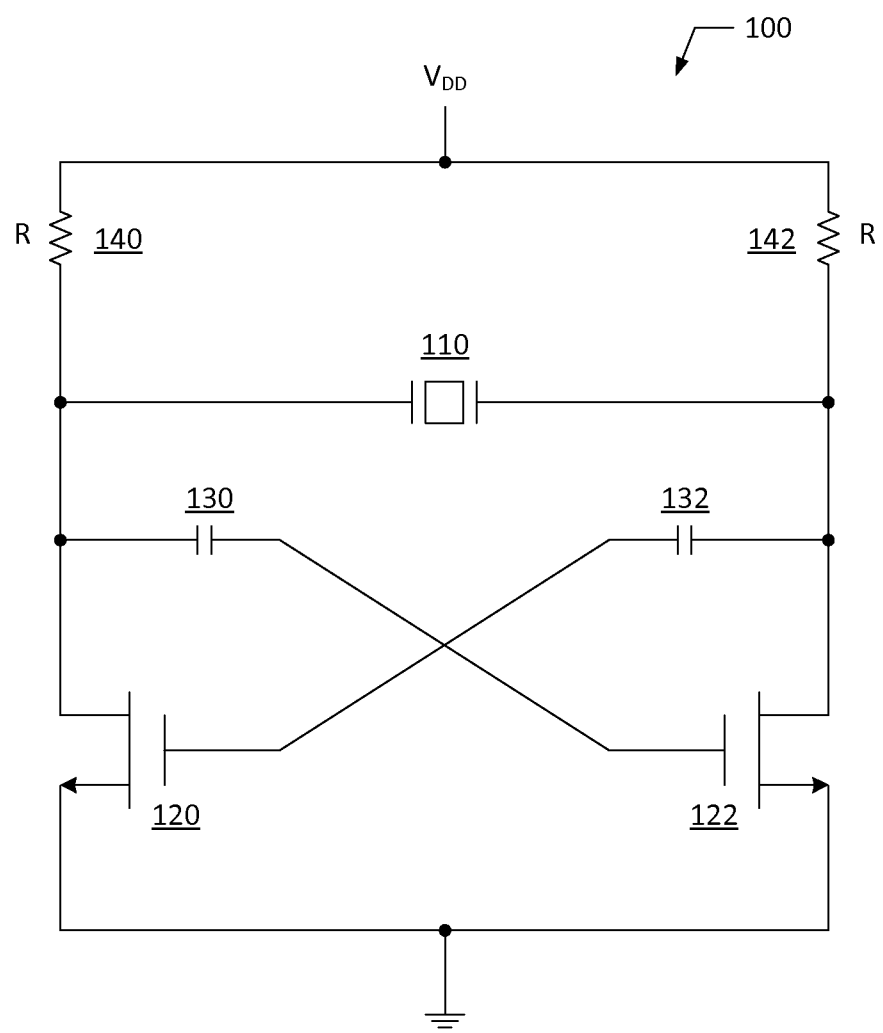
FIG. 1 is a schematic diagram of a conventional differential XO circuit.

As described above, conventional differential XO circuit designs have used a negative conductance (−gm) of a modified cross-coupled pair of transistors as an active device and have added high-pass filtering to avoid latching at low frequencies. For example, FIG. 1 is a schematic diagram of a conventional differential XO circuit 100. In FIG. 1, the differential oscillation is achieved using a cross-coupled pair of field-effect transistors (FETs) 120, 122 and a resonator 110. A supply voltage ($V_{DD}$) couples to the drain terminals of the cross-coupled FETs 120, 122 through resistors 140, 142. Two AC coupling capacitors 130, 132 are added to provide high-pass filtering and, therefore, close-to-zero DC gain. However, this configuration could still cause latch up rather than provide oscillation under certain conditions.

Several embodiments as described herein use different configurations to provide a differential XO circuit. In one embodiment, a cross-coupled pair of transistors is used as a main oscillation device. However, to avoid latching at low frequencies, a metal-oxide semiconductor field-effect transistor (MOSFET) diode with a resistor in the feedback loop is added to each branch of the cross-coupled pair of transistors. At low frequencies, the MOSFET diode acts as a low-impedance load ($1/g_m$), which reduces the loop gain and prevents latching. At higher frequencies, the impedance of the circuit rises to the value of the resistor in the feedback loop of the MOSFET diode and increases the loop gain. The value of the resistor may be appropriately adjusted to provide the high impedance at higher frequencies. Accordingly, the new configurations enable the XO circuit to start and sustain oscillation with less additional circuitry and higher swings. After reading this description it will become apparent how to implement the invention in various implementations and applications. Although various implementations of the present invention will be described herein, it is understood that these implementations are presented by way of example only, and not limitation. As such, this detailed description of various implementations should not be construed to limit the scope or breadth of the present invention.

Figure 2A:
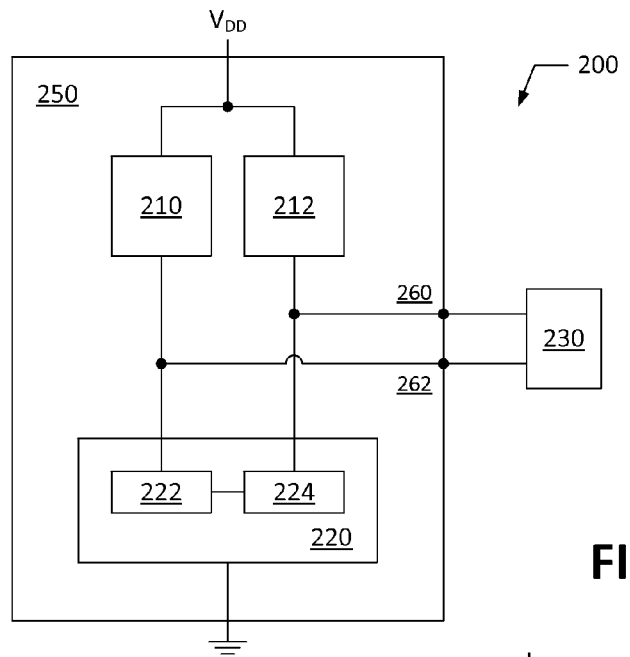
FIG. 2A is a functional block diagram of a differential XO circuit configured on a chip and a resonator in accordance with one embodiment of the present invention.

FIG. 2A is a functional block diagram of a differential XO circuit 200 configured on a chip (including a differential oscillator driver circuit 250) and a reference resonator 230 in accordance with one embodiment of the present invention. The resonator 230 may be formed from a variety of resonating crystalline materials, including quartz and tourmaline. For example, the resonator 230 may be formed from a piece of quartz that is precisely cut, sized and shaped to resonate at a particular frequency. In one embodiment, the resonator 230 is a quartz resonator. In another embodiment, the resonator 230 is an LC tank resonator.

In the illustrated embodiment of FIG. 2A, the resonator 230 connects to the oscillator driver circuit 250 through a pair of terminals 260, 262, which are output terminals of the oscillator driver circuit 250. The resonator 230 is preferably mounted off-chip from the differential oscillator driver circuit 250. The oscillator driver circuit 250 includes a cross-coupled oscillation unit 220, including a first part 222 and a second part 224, and a pair of loads 210, 212. The first part 222 is coupled to the load 210 and the second part 224 is coupled to the load 212. Further, the pair of loads 210, 212 is coupled to the supply voltage ($V_{DD}$) and the oscillation device 220 is connected to the ground voltage. In operation, the differential oscillator driver circuit 250 drives the resonator 230 to oscillate at a particular frequency in order to define a sinusoidal and differential output signal across the two symmetrical output terminals 260, 262 of the differential XO circuit 200. The sinusoidal and differential output signal is suitable for use in various applications, such as phase locked loops, frequency tunable digital filters, direct digital frequency synthesizers, and similarly-functioning devices.

Figure 2B:
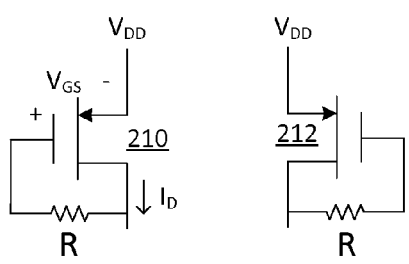
FIG. 2B shows loads configured as PMOS diodes with resistor (R) in the feedback loop.
Figure 2C:
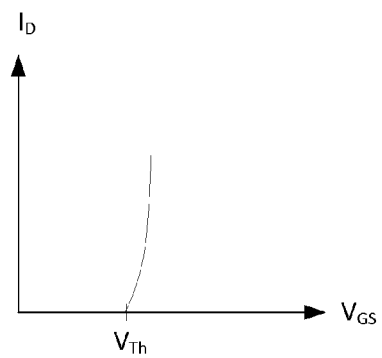
FIG. 2C is an $I_D$-$V_{GS}$ characteristic curve of a MOSFET diode.

In one embodiment shown in FIG. 2B, each of the pair of loads 210, 212 is configured as a MOSFET diode with a resistor (R) in the feedback loop. A typical value for the resistor R is in the range of a few KΩ. In FIG. 2B, the MOSFET diodes 210, 212 are configured as p-channel MOSFET (PMOS) diodes, which conduct current in only one direction when the voltage at the gate terminal of the PMOS diode exceeds a threshold voltage ($V_{Th}$). As shown in FIG. 2C, beyond the threshold voltage ($V_{Th}$), the characteristic of a MOSFET diode (reflected in the $I_D$-$V_{GS}$ curve) appears very similar to a diode with quadratic I-V characteristics. The drain current $I_D$ can be expressed as follows:

$$I_D = \frac{W}{2L} * \mu_n * C_{ox} * (V_{GS} - V_{Th})^2 \quad (1)$$

where $I_D$=drain current;
W/L=width-to-length ratio;
$\mu_n$=electron mobility;
$C_{ox}$=gate capacitance per unit area;
$V_{GS}$=gate-to-source voltage;
$V_{Th}$=threshold voltage.

Referring back to FIG. 2B, the resistor (R) is connected between the gate terminal and the drain terminal of the PMOS diode. The source terminal of the PMOS diode is connected to the supply voltage ($V_{DD}$). Accordingly, the impedances of the MOSFET diode loads 210, 212 are low ($1/g_m$) at low frequencies, because the feedback resistor (R) is disconnected, and the impedances of the MOSFET diode loads 210, 212 at high frequencies are high at the value of the feedback resistor (R). As stated above, the low impedance of the load at the low frequencies reduces the loop gain and prevents latching. Further, the high impedance of the load at the higher frequencies increases the impedance of the circuit to the value of the resistor in the feedback loop and increases the loop gain. In other embodiments, the loads 210, 212 may be configured as n-channel MOSFET (NMOS) diodes with the resistor (R) connected between the gate terminal and the drain terminal of each of the NMOS diodes with the source terminals of the NMOS diodes connected to the ground voltage.

Figure 2D:
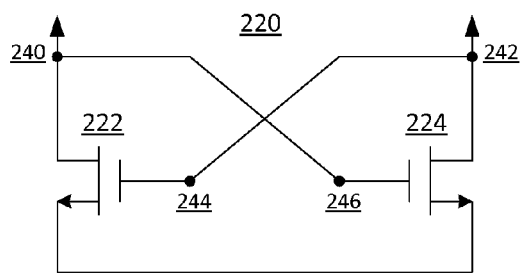
FIG. 2D is a main oscillation device configured as a cross-coupled pair of NMOS transistors.

In one embodiment shown in FIG. 2D, the main oscillation device 220 is configured as a cross-coupled pair of transistors 222, 224. In this embodiment, the gate terminal 244 of the first transistor 222 is connected to the drain terminal 242 of the second transistor 224, while the gate terminal 246 of the second transistor 224 is connected to the drain terminal 240 of the first transistor 222. In the illustrated embodiment of FIG. 2D, the cross-coupled pair of transistors 222, 224 is configured with NMOS transistors.

Figure 3:
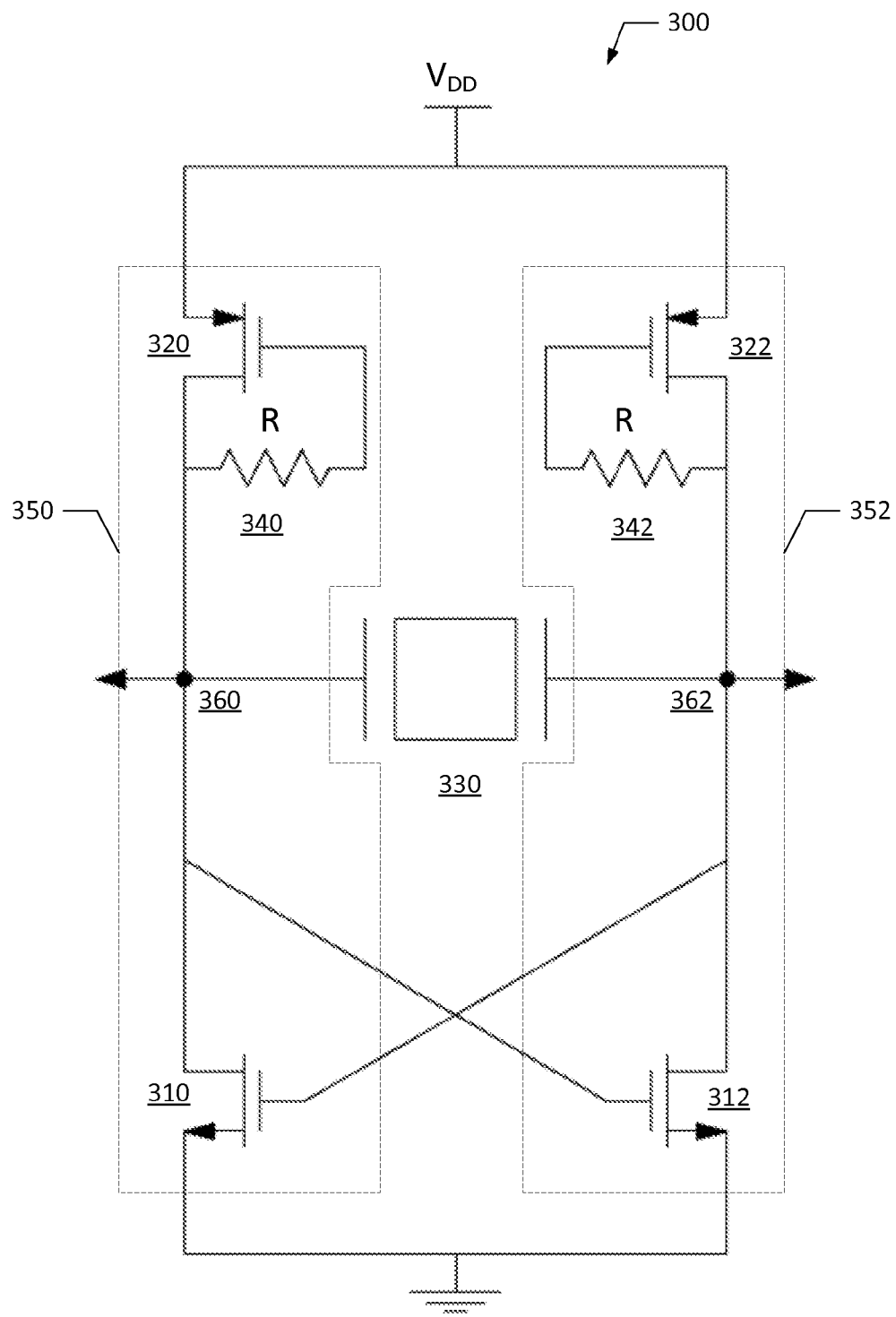
FIG. 3 is a schematic diagram of a differential XO circuit configured with two branches in accordance with one embodiment of the present invention.

FIG. 3 is a schematic diagram of a differential XO circuit 300 configured with two branches 350, 352 in accordance with one embodiment of the present invention. In the illustrated embodiment of FIG. 3, a cross-coupled pair of NMOS transistors 310, 312 is arranged in a differential configuration with a first transistor 310 in a first branch 350 and a second transistor 312 in a second branch 352. The gate terminal of the first transistor 310 is connected to the drain terminal of the second transistor 312, while the gate terminal of the second transistor 312 is connected to the drain terminal of the first transistor 310. An off-chip reference resonator 330 is connected to the drain terminals of the first and second transistors 310, 312. Further, in the first branch 350, the drain terminal of the first transistor 310 is connected to the drain terminal of a first PMOS diode 320, which includes a resistor 340 with value R in the feedback loop between the gate terminal and the drain terminal. Correspondingly, in the second branch 352, the drain terminal of the second transistor 312 is connected to the drain terminal of a second PMOS diode 322, which includes a resistor 342 with value R in the feedback loop between the gate terminal and the drain terminal.

In FIG. 3, the first PMOS diode 320 acts as a low-impedance load ($1/g_m$) at low frequencies and acts as a high-impedance load (R) at higher frequencies, for the first branch 350. The second PMOS diode 322 acts as a low-impedance load ($1/g_m$) at low frequencies and acts as a high-impedance load (R) at higher frequencies, for the second branch 352. In operation, when the voltage at the gate terminal of the PMOS diode 320 exceeds a threshold voltage, the power supply supplies the current to the source terminal and through to the drain terminal of the PMOS diode 320. Further, when the voltage at the gate terminal of the PMOS diode 322 exceeds the threshold voltage, the power supply supplies the current to the source terminal and through to the drain terminal of the PMOS diode 322. The voltages at the gate terminals of the PMOS diodes 320, 322 are determined by the oscillation voltage of the reference resonator 330. Although in the embodiment shown in FIG. 3, the transistors 310, 312 are configured with NMOS transistors, the transistors 310, 312 can be configured with PMOS transistors.

Node 360 connects one terminal of the reference resonator 330, the drain terminal of the first NMOS transistor 310, and the drain terminal of the first PMOS diode 320. Further, node 362 connects the other terminal of the reference resonator 330, the drain terminal of the second NMOS transistor 312, and the drain terminal of the second PMOS diode 322. The source terminals of the first and second PMOS diodes 320, 322 are connected together to the supply voltage ($V_{DD}$), while the source terminals of the first and second NMOS transistors 310, 312 are connected together to the ground voltage.

Figure 4:
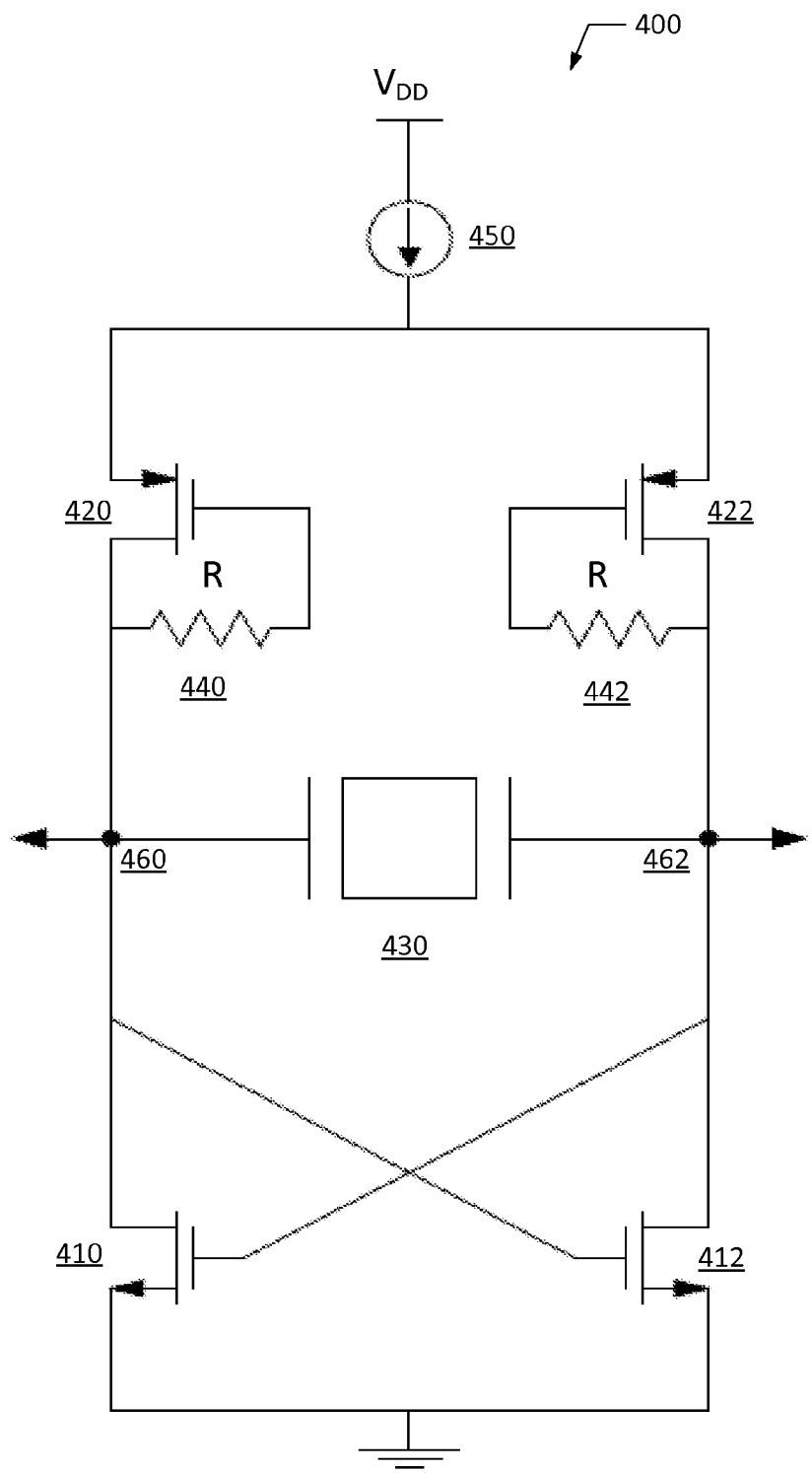
FIG. 4 is a schematic diagram of a differential XO circuit in accordance with another embodiment of the present invention.

FIG. 4 is a schematic diagram of a differential XO circuit 400 in accordance with another embodiment of the present invention. In the illustrated embodiment of FIG. 4, a current source 450 is added to supply the PMOS diodes 420, 422 with an appropriate amount of current. Thus, when the voltage at the gate terminal of the PMOS diode 420 exceeds the threshold voltage, the current source 450 supplies the current to the source terminal and through to the drain terminal of the PMOS diode 420. Further, when the voltage at the gate terminal of the PMOS diode 422 exceeds the threshold voltage, the current source 450 supplies the current to the source terminal and through to the drain terminal of the PMOS diode 422. The voltages at the gate terminals of the PMOS diodes 420, 422 are determined by the oscillation voltage of a resonator 430.

As before with FIG. 3, a cross-coupled pair of NMOS transistors 410, 412 is arranged in a differential configuration, wherein the gate terminal of the first transistor 410 is connected to the drain terminal of the second transistor 412, while the gate terminal of the second transistor 412 is connected to the drain terminal of the first transistor 410. The resonator 430 is connected to the drain terminal of the first and second transistors 410, 412. Node 460 connects one terminal of the reference resonator 430, the drain terminal of the first transistor 410, and the drain terminal of the first PMOS diode 420. Further, node 462 connects the other terminal of the reference resonator 430, the drain terminal of the second transistor 412, and the drain terminal of the second PMOS diode 422. The source terminals of the first and second PMOS diodes 420, 422 are connected to the current source 450.

Figure 5:
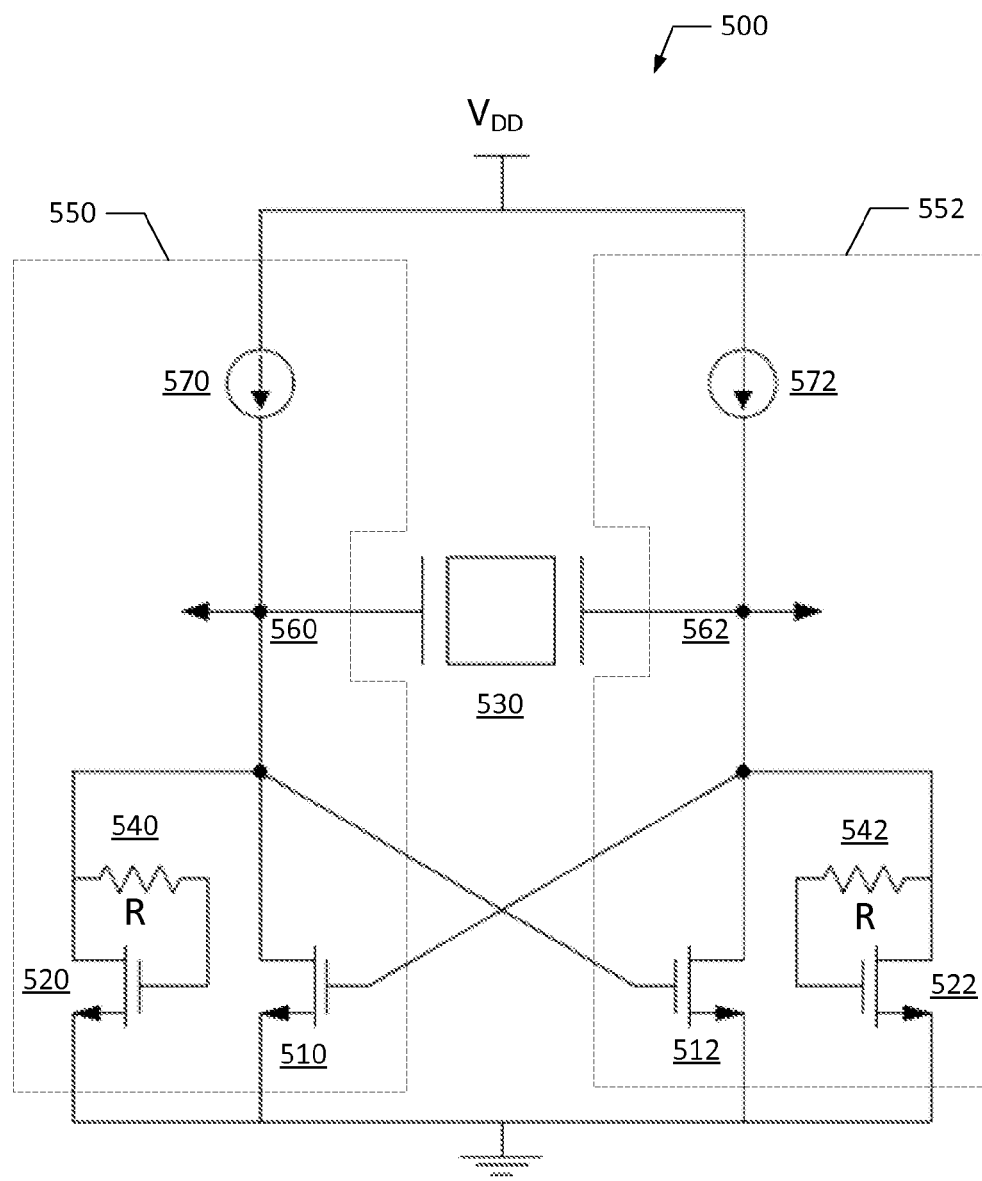
FIG. 5 is a schematic diagram of a differential XO circuit in accordance with yet another embodiment of the present invention.

FIG. 5 is a schematic diagram of a differential XO circuit 500 in accordance with yet another embodiment of the present invention. In the illustrated embodiment of FIG. 5, each current source of a pair of current sources 570, 572 is added to each branch 550, 552, while the impedance loads of MOS diodes 520, 522 have been moved to connect in parallel with the cross-coupled pair of transistors 510, 512. In FIG. 5, the impedance loads of MOS diodes 520, 522 are configured as NMOS diodes connected in parallel with the cross-coupled pair of NMOS transistors 510, 512.

The cross-coupled pair of NMOS transistors 510, 512 is arranged in a differential configuration with a first transistor 510 in a first branch 550 and a second transistor 512 in a second branch 552. The gate terminal of the first transistor 510 is connected to the drain terminal of the second transistor 512, while the gate terminal of the second transistor 512 is connected to the drain terminal of the first transistor 510. A reference resonator 530 is connected to the drain terminal of the first and second transistors 510, 512. Further, in the first branch 550, the drain terminal of the first transistor 510 is connected to the drain terminal of the first NMOS diode 520, while the source terminal of the first transistor 510 is connected to the source terminal of the first NMOS diode 520, which includes a resistor 540 with value R in the feedback loop between the gate and the drain terminals. Thus, the first transistor 510 and the first NMOS diode 520 are connected in parallel. As stated above, the first NMOS diode 520 acts as a low-impedance load ($1/g_m$) at low frequencies and acts as a high-impedance load (R) at higher frequencies, for the first branch 550. Correspondingly, in the second branch 552, the drain terminal of the second transistor 512 is connected to the drain terminal of the second NMOS diode 522, while the source terminal of the second transistor 512 is connected to the source terminal of the second NMOS diode 522, which includes a resistor 542 with value R in the feedback loop between the gate and the drain terminals. Thus, the second transistor 512 and the second NMOS diode 522 are connected in parallel. The second NMOS diode 522 acts as a low-impedance load ($1/g_m$) at low frequencies and acts as a high-impedance load (R) at higher frequencies, for the second branch 552.

Node 560 connects one terminal of the reference resonator 530, the drain terminal of the first transistor 510, and the drain terminal of the first NMOS diode 520. Further, node 562 connects the other terminal of the reference resonator 530, the drain terminal of the second transistor 512, and the drain terminal of the second NMOS diode 522. The source terminals of the first and second NMOS diodes 520, 522 are connected to the source terminal of the first and second transistors 510, 512, and to the ground voltage.

In operation, when the voltage at the gate terminal of the NMOS diode 520 exceeds the threshold voltage, the current source 570 supplies the current to the drain terminal and through to the source terminal of the NMOS diode 520. Further, when the voltage at the gate terminal of the NMOS diode 522 exceeds the threshold voltage, the current source 572 supplies the current to the drain terminal and through to the source terminal of the NMOS diode 522. The voltages at the gate terminals of the NMOS diodes 520, 522 are determined by the oscillation voltage of the reference resonator 530.

The differential configurations of FIGS. 3, 4, and 5 provide substantial advantages over the conventional designs of a differential XO circuit by reducing the loop gain and preventing latching at low frequencies and by increasing the impedance of the circuit (to R) and the loop gain at higher frequencies.

Figure 6:
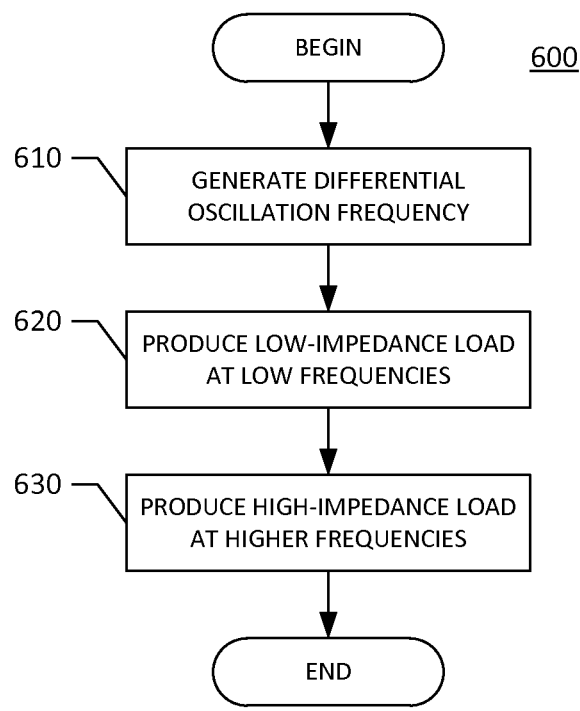
FIG. 6 is a functional flow diagram illustrating a method for generating an oscillation frequency at output terminals of a differential oscillator circuit in accordance with one embodiment of the present invention.

FIG. 6 is a functional flow diagram illustrating a method 600 for generating an oscillation frequency at output terminals of a differential oscillator circuit in accordance with one embodiment of the present invention. In one embodiment, the differential oscillation frequency is generated, at step 610, using a cross-coupled pair of transistors 310, 312 and a reference resonator 330 coupled between the output terminals 360, 362 of the differential oscillator circuit 300. The cross-coupled pair of transistors 310, 312 is arranged in a differential configuration, wherein the gate terminal of a first transistor 310 is connected to the drain terminal of a second transistor 312, while the gate terminal of the second transistor 312 is connected to the drain terminal of the first transistor 310. In one embodiment, the reference resonator 330 is usually configured to be located off-chip from the differential oscillation circuit. At step 620, a low-impedance load is produced at low frequencies with a pair of MOSFET diodes 320, 322 coupled to the cross-coupled pair of transistors 310, 312. The low-impedance load at the low frequencies is the inverse of the transconductance ($1/g_m$), which is a very small value. At step 630, a high-impedance load is produced at higher frequencies with the same pair of MOSFET diodes 320, 322 coupled to the cross-coupled pair of transistors 310, 312. The high-impedance load at the higher frequencies is the value of the resistor (R) in the feedback of the MOSFET diode, between the gate and the drain terminals. The value R of the resistor should be adjusted to provide the high-impedance load.

Although several embodiments of the invention are described above, many variations of the invention are possible. For example, although the illustrated embodiments show MOSFET diodes as providing both low and high frequency loads, any configurations of circuits which provide appropriate loads for two different frequencies can be used. Further, features of the various embodiments may be combined in combinations that differ from those described above. Moreover, for clear and brief description, many descriptions of the systems and methods have been simplified. Many descriptions use terminology and structures of specific standards. However, the disclosed systems and methods are more broadly applicable.

Those of skill will appreciate that the various illustrative blocks and modules described in connection with the embodiments disclosed herein can be implemented in various forms. Some blocks and modules have been described above generally in terms of their functionality. How such functionality is implemented depends upon the design constraints imposed on an overall system. Skilled persons can implement the described functionality in varying ways for each particular application, but such implementation decisions should not be interpreted as causing a departure from the scope of the invention. In addition, the grouping of functions within a module, block, or step is for ease of description. Specific functions or steps can be moved from one module or block without departing from the invention.

The various illustrative logical blocks, units, steps, components, and modules described in connection with the embodiments disclosed herein can be implemented or performed with a processor, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but in the alternative, the processor can be any processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Further, circuits implementing the embodiments and functional blocks and modules described herein can be realized using various transistor types, logic families, and design methodologies.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent presently preferred embodiments of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

What is claimed is:

1. A differential crystal oscillator circuit, comprising:
   first and second output terminals;
   a cross-coupled oscillation unit including first and second transistors cross-coupled to the first and second output terminals;
   first and second metal-oxide semiconductor field-effect transistor (MOSFET) diodes, the first MOSFET diode including a third transistor with a gate terminal of the third transistor only connected to a drain terminal of the third transistor through a first resistor, the second MOSFET diode including fourth transistor with a gate terminal of the fourth transistor only connected to a drain terminal of the fourth transistor through a second resistor,
   wherein the first MOSFET diode couples to the first transistor to provide low-impedance load at low frequencies and high-impedance load at higher frequencies to the first transistor,
   wherein the second MOSFET diode couples to the second transistor to provide low-impedance load at low frequencies and high-impedance load at higher frequencies to the second transistor; and
   a reference resonator coupled between the first and second output terminals to establish an oscillation frequency.

2. The circuit of claim 1, wherein the first and second MOSFET diodes are configured as first and second p-channel MOSFET (PMOS) diodes, respectively.

3. The circuit of claim 2, further comprising
   a current source coupled to source terminals of the first and second PMOS diodes, and to a supply voltage.

4. The circuit of claim 1, wherein source terminals of the first and second MOSFET diodes are coupled to a supply voltage.

5. The circuit of claim 1, wherein the first and second transistors are configured as n-channel MOSFET (NMOS) transistors.

6. The circuit of claim 5, wherein source terminals of the NMOS transistors are coupled to a ground voltage.

7. The circuit of claim 1, wherein drain terminals of the first and second MOSFET diodes are coupled to drain terminals of the first and second transistors.

8. The circuit of claim 1, wherein the first and second MOSFET diodes are configured as first and second n-channel MOSFET (NMOS) diodes, respectively.

9. The circuit of claim 8, wherein source terminals of the first and second NMOS diodes are coupled to source terminals of the first and second transistors and to a ground voltage.

10. The circuit of claim 9, further comprising
    first and second current sources coupled to drain terminals of the first and second NMOS diodes and drain terminals of the first and second transistors,
    wherein the first and second current sources are also coupled to a supply voltage.

11. A method of generating an oscillation frequency at output terminals of a differential oscillator circuit, the method comprising:
    generating the oscillation frequency using a cross-coupled pair of transistors and a reference resonator coupled between the output terminals;
    producing low-impedance load at low frequencies and high-impedance load at higher frequencies using MOSFET diodes coupled to the cross-coupled pair of transistors,
    wherein each of the MOSFET diodes includes a resistor connected between gate and drain terminals; and
    supplying current between a supply voltage and a parallel combination of the MOSFET diodes and the cross-coupled pair of transistors.

12. The method of claim 11, wherein supplying current comprises supplying current through a transistor of each diode of the MOSFET diodes when a voltage at a gate terminal of the transistor exceeds a threshold voltage.

13. The method of claim 11, further comprising
coupling the cross-coupled pair of transistors to a ground voltage.

14. An apparatus for generating an oscillation frequency at output terminals of a differential oscillator circuit, the apparatus comprising:
  means for generating the oscillation frequency using a cross-coupled pair of transistors by driving a reference resonator coupled between the output terminals;
  means for producing low-impedance load at low frequencies and high-impedance load at higher frequencies using MOSFET diodes coupled to the cross-coupled pair of transistors,
  wherein the means for producing is coupled to the means for generating; and
  means for supplying current between a supply voltage and a parallel combination of the MOSFET diodes and the cross-coupled pair of transistors.

15. The apparatus of claim 14, wherein means for supplying current comprises
  means for supplying current through a transistor of each diode of the MOSFET diodes when a voltage at a gate terminal of the transistor exceeds a threshold voltage.

16. The apparatus of claim 14, further comprising
  means for coupling the means for generating to a ground voltage.

* * * * *